US 6,627,020 B2

(12) United States Patent
Natarajan et al.

(10) Patent No.: US 6,627,020 B2
(45) Date of Patent: Sep. 30, 2003

(54) METHOD FOR SINTER DISTORTION CONTROL

(75) Inventors: Govindarajan Natarajan, Pleasant Valley, NY (US); Raschid Jose Bezama, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 09/944,334

(22) Filed: Aug. 31, 2001

(65) Prior Publication Data

US 2003/0041947 A1 Mar. 6, 2003

(51) Int. Cl.[7] .............................................. B32B 31/26
(52) U.S. Cl. ................. 156/89.12; 156/89.15; 156/89.16; 156/89.18; 156/89.19; 156/89.21; 156/267
(58) Field of Search ........................ 156/89.11, 89.12, 156/89.16, 89.18, 89.19, 89.21, 89.15, 267; 29/851; 428/210, 901

(56) References Cited

U.S. PATENT DOCUMENTS

| | | | |
|---|---|---|---|
| 4,237,606 A | * | 12/1980 | Niwa et al. |
| 4,677,254 A | * | 6/1987 | Boss et al. |
| 4,753,694 A | * | 6/1988 | Herron et al. |
| 5,009,744 A | * | 4/1991 | Mandai et al. |
| 5,102,720 A | * | 4/1992 | Raj |
| 5,370,760 A | | 12/1994 | Mori et al. |
| 5,755,903 A | * | 5/1998 | Garant et al. |
| 5,801,073 A | | 9/1998 | Robbins et al. |
| 6,221,193 B1 | * | 4/2001 | Cassidy et al. ...... 156/89.12 X |
| 6,432,239 B1 | * | 8/2002 | Mandai et al. ........... 156/89.12 |
| 6,468,640 B2 | * | 10/2002 | Nishide et al. |

FOREIGN PATENT DOCUMENTS

JP        2001-144437      *  5/2001

\* cited by examiner

*Primary Examiner*—Curtis Mayes
(74) *Attorney, Agent, or Firm*—James J. Cioffi

(57) ABSTRACT

A method to control the post sinter distortion of free sintered multilayer ceramic substrates by placing a discrete non-densifying structure in the green ceramic laminate prior to sintering. One or several discrete non-densifying structures are placed on one or more ceramic greensheets which are then stacked and laminated to form a green ceramic laminate. The laminate is then sintered and the discrete non-densifying structure will locally control the dimensions of the free sintered multilayer ceramic substrate. The method can be used to control post sinter dimensions in MLC substrates manufactured as either single or multi-up substrates by placing the discrete non-densifying structure in the active area or in the kerf area between the individual product ups prior to sintering.

20 Claims, 5 Drawing Sheets

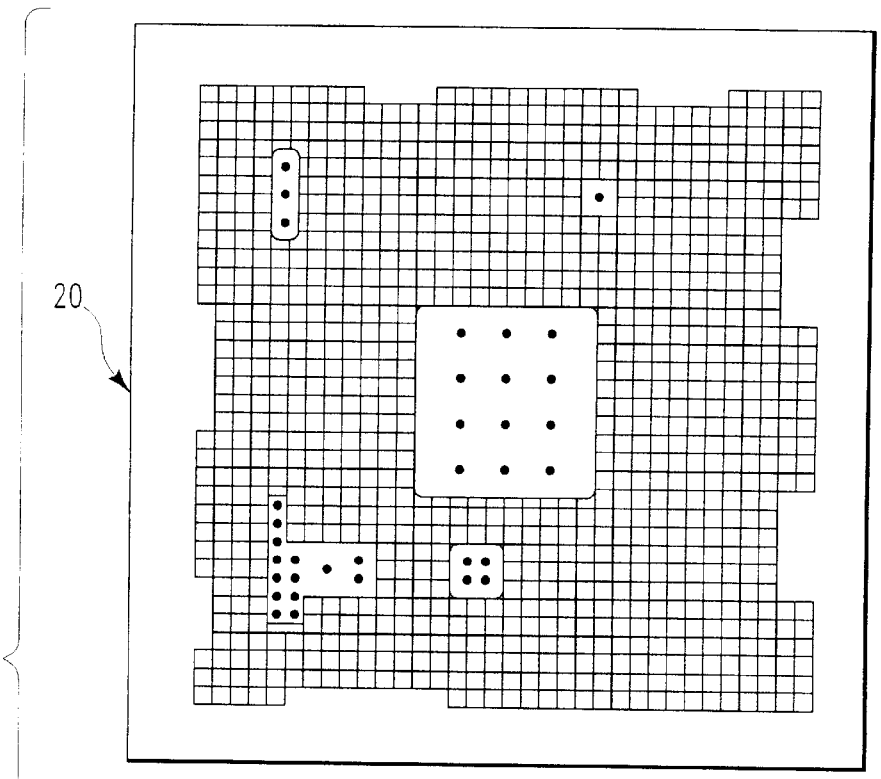
FIG. 1A (Prior Art)
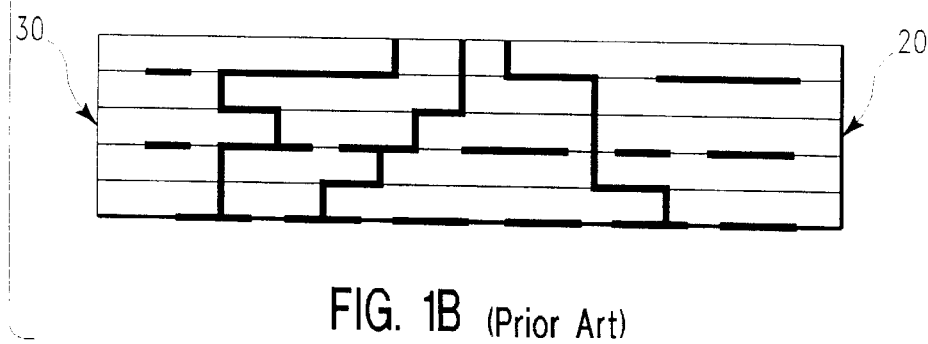
FIG. 1B (Prior Art)
(Prior Art)
FIG. 1

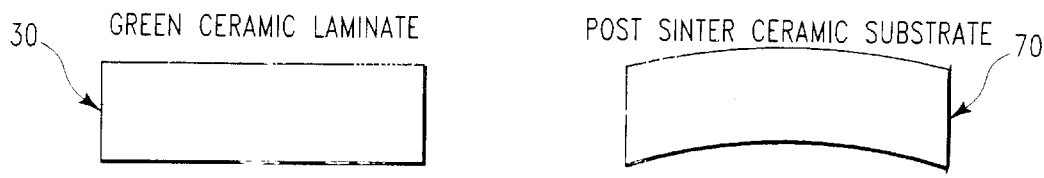
FIG. 2A (Prior Art)
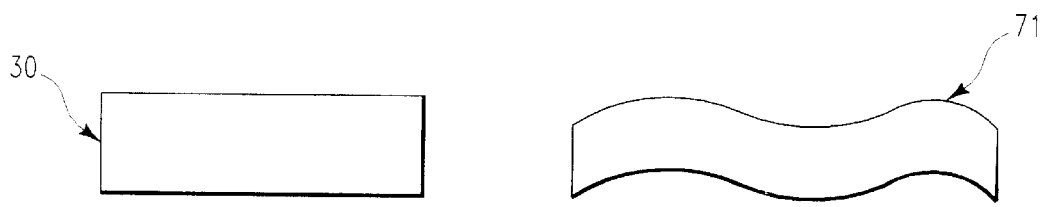
FIG. 2B (Prior Art)
FIG. 2C (Prior Art)
FIG. 2D (Prior Art)
FIG. 2 (Prior Art)

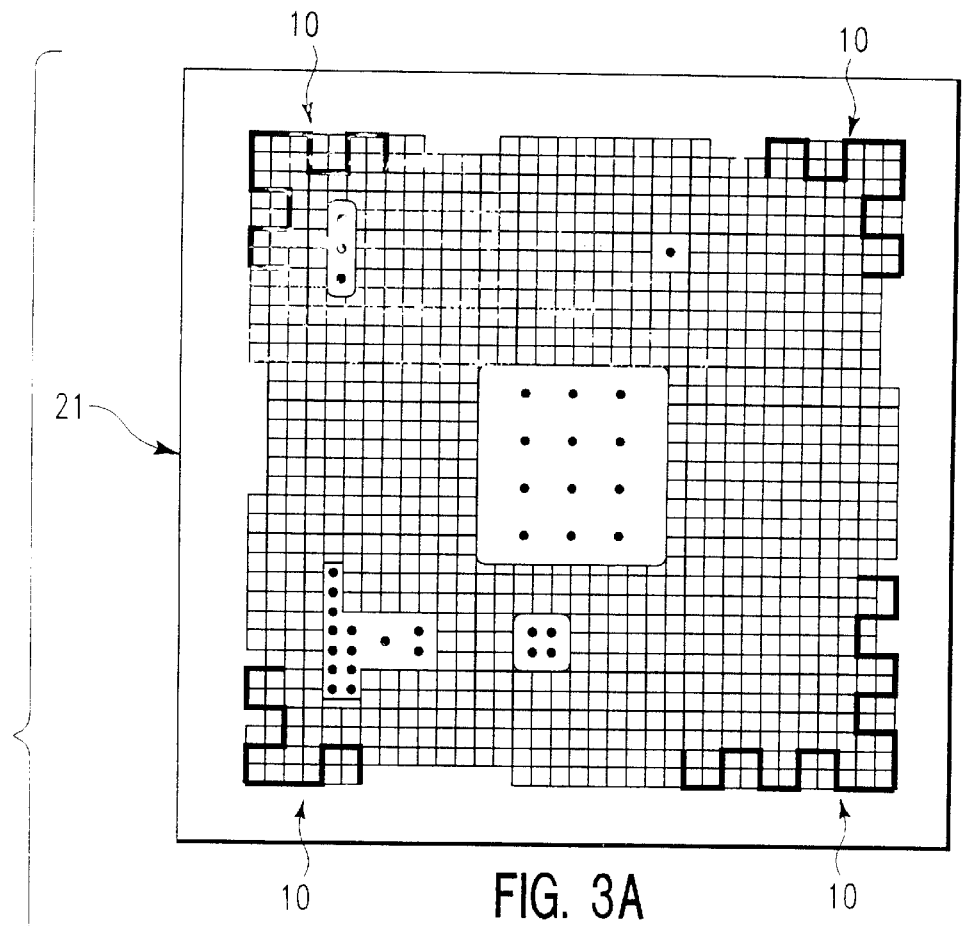
FIG. 3A
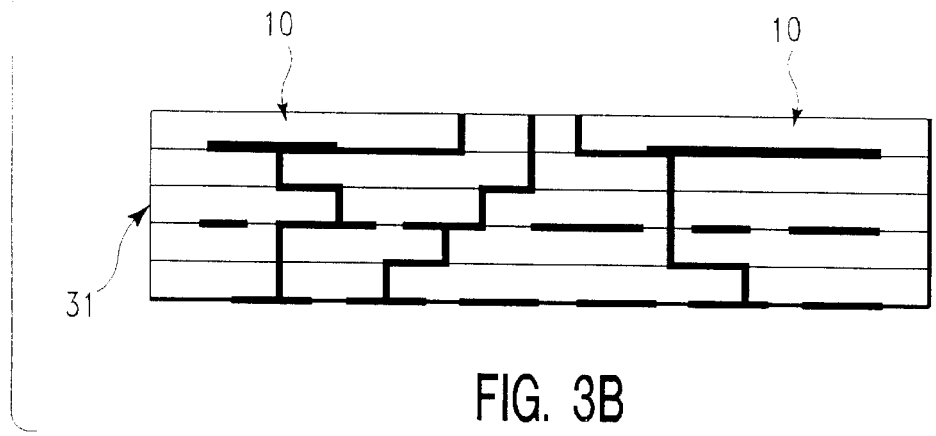
FIG. 3B
FIG. 3

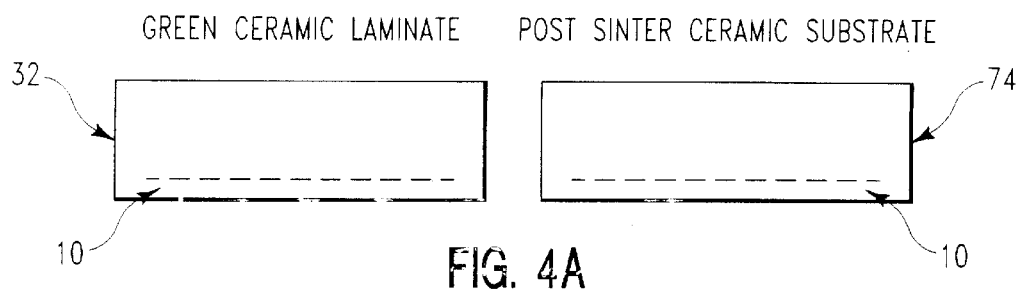
FIG. 4A
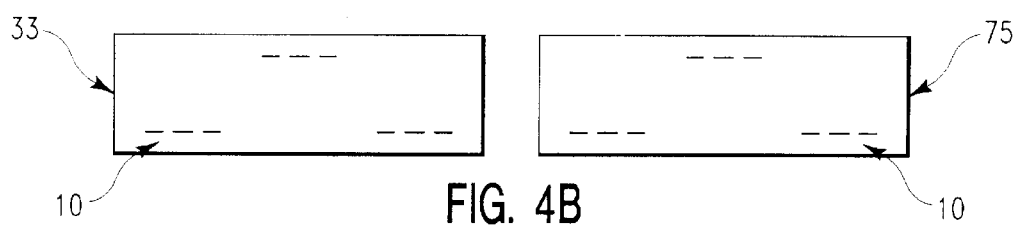
FIG. 4B
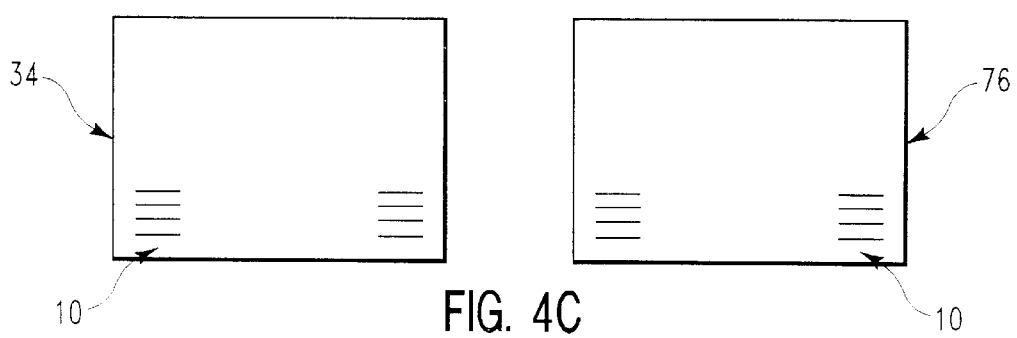
FIG. 4C
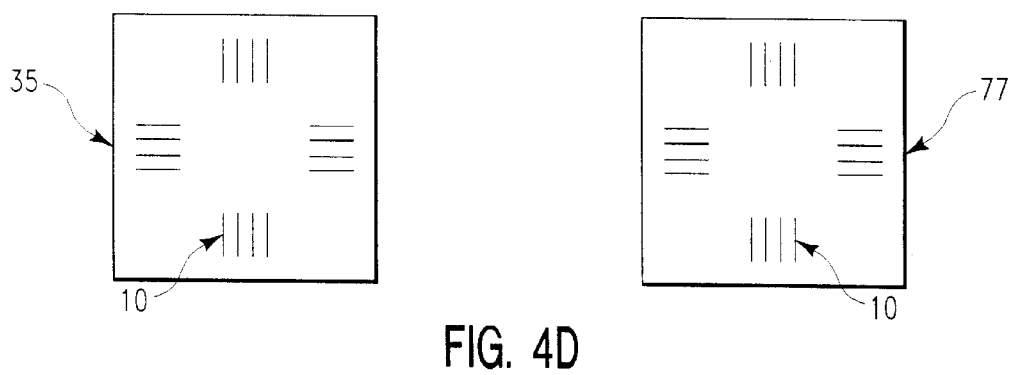
FIG. 4D
FIG. 4

METHOD FOR SINTER DISTORTION CONTROL

BACKGROUND OF THE INVENTION

The present invention relates in general to the control of distortion during high temperature processing, and, more particularly, in the sintering process of metallized multilayer ceramic (MLC) substrates.

In the manufacture of MLC substrates, ceramic greensheets are formed from a casting slurry. The individual ceramic greensheets are personalized with via holes and conductive metal. The ceramic greensheets are then stacked together in a predetermined design sequence to form a green ceramic laminate. After the greensheets are stacked, heat and pressure are applied to the greensheets to provide a green ceramic laminate with continuous conductive metal wiring whose layers will remain contiguous during subsequent processing. This process of applying heat and pressure to the stacked greensheets is called lamination. The green ceramic laminate is then fired at high temperature in a process called sintering.

During the sintering process, employed primarily for densifying the ceramic and the conductive metal materials in MLC substrates, large volume shrinkage of the MLC substrate typically occurs. In general the ceramic and conductive metal materials have wide variations in physical and transport properties. The onset of densification and the densification profiles between the ceramic and metal differ widely as well. These variations result in distortion in the pattern of the conductive metal features as well as distortion in the substrate body shape. Distortion is a general term for the deviation in post sinter dimensions from ideal design dimensions. Distortion in the body shape includes deviations in surface flatness called camber. Distortion control requires the conductive metal and the ceramic material to have similar rates of shrinkage. However even with careful selection of materials, variations in material from lot to lot can result in unpredictable shrinkage. Shrinkage dissimilarities result in post sinter distortion. In MLC substrates this distortion can manifest itself as substrate warping, substrate camber and variations in the height of surface metal pads. This distortion results in rework and added cost since increasingly tight dimensional control is required for the assembly of electronic devices and packages.

The process of manufacturing MLC substrates involves multiple processes which directly impact the product dimensions during the sintering step. Extensive effort is expended at increased cost to control the MLC substrate post sinter dimensions. Advances in microelectronic technology have continuously increased the number of chip I/O (input/output) while decreasing the corresponding chip size. This creates a demand for MLC substrates with decreasing top surface metal (TSM) interconnect dimensions. In addition, cost reduction has driven reduced product sizes with a corresponding demand to increase MLC substrate bottom surface I/O pad density. Therefore, there is a need for cost-effective distortion control in MLC substrate manufacturing.

There are a number of methods employed currently to control substrate dimensions during MLC substrate manufacturing. An additional sinter process under pressure is applicable to all designs and will reduce ceramic distortion. However this process is an expensive cost adder which also results in additional product yield loss. Tailoring the type of conductive metal used throughout the substrate may be employed to control distortion after a design is complete, but this is only useful to control global distortion. This solution is not comprehensive and does not address the problem of random or local distortion. Green sheet stack lamination pressure adjustment is another technique to control distortion. However this technique is effective only in controlling global expansion. Finally, product redesign can be used to reduce distortion by adjusting the conductive metal distribution in key areas. However, this is undesirable since it is very costly and impacts new product time to market. It is not always possible to redesign as it is a trial and error technique and might compromise performance. The existing procedures and models used to control product dimensions are not fully predictive, and are therefore not dependable.

There are methods proposed by others to improve the dimensional control of electronic packages. Robbins et al. U.S. Pat. No. 5,801,073, the disclosure of which is incorporated by reference herein, discloses a method for producing an electronic packaging device made of dissimilar materials within a package. Robbins discloses a method to achieve minimal overall shrinkage of the package by the use of a high purity reaction bonded silicon nitride as a dielectric ceramic material.

Mori et al. U.S. Pat. No. 5,370,760, the disclosure of which is incorporated by reference herein, discloses a method to reduce the distortion of the metallized features in a ceramic laminate during the lamination process prior to sintering. Mori discloses the use of a die assembly, which is a tool, having an outer portion and an inner portion which can compress the outer peripheral portion of the laminate to a higher degree than the central portion of the laminate. This disclosure does not address the control of distortion induced during the sintering process.

Notwithstanding the prior art there remains a need to control the dimensions of MLC substrates already designed, but which fail to meet their post sinter dimensional requirements, and whose local or random distortion is not amenable to the existing dimensional control methods.

BRIEF SUMMARY OF THE INVENTION

The inventors have discovered that the addition of properly tailored non-densifying structures, such as discontinuous thin metal structures, to the green ceramic laminate improves the local dimensional control of the ceramic product during the sintering process.

In one embodiment, the invention provides a method to control local post sinter dimensions of free sintered multilayer ceramic substrates by placing a mostly non-reacting discrete thin metal structure in the green ceramic laminate prior to sintering. One or several non-densifying structures are placed on one or more personalized ceramic greensheets which are then stacked and laminated to form a green ceramic laminate. The laminate is then sintered and the non-densifying structure will control the local dimensions of the free sintered multilayer ceramic substrate.

In another embodiment, the invention provides a method to control local post sinter dimensions in MLC substrates manufactured as a multi-up laminate, i.e., a laminate containing more than one individual product substrate, by placing at least one discrete non-densifying structure in the kerf area between the individual product ups prior to sintering and then separating the discrete non-densifying structure from the product using post sinter wet sizing. One or more non-densifying structures are placed on one or more multi-up personalized ceramic greensheets in the kerf area between the individual product samples. The multi-up personalized ceramic greensheets are stacked and laminated to form a multi-up green ceramic laminate which is then sintered wherein the non-densifying structures will control the local dimensions of the multilayer ceramic substrate. After sintering, the substrate (sintered laminate) will be sized into the individual product samples separating the non-densifying structures from each individual multilayer ceramic substrate.

In another embodiment of the invention a discrete non-densifying structure is used to control the local post sinter distortion of a multi-up multilayer ceramic substrate and another discrete non-densifying structure is used to control the local distortion within the individual product samples within the MLC substrate during sintering. A first discrete non-densifying structure is placed on one or more multi-up personalized ceramic greensheets in the product area of the individual ups. A second discrete non-densifying structure is placed on one or more multi-up personalized ceramic greensheets in the kerf area between the individual product ups. The multi-up personalized ceramic greensheets are stacked and laminated to form a multi-up green ceramic laminate which is sintered wherein the first and second discrete non-densifying structures will control the local post sinter distortion of the multi-up multilayer ceramic substrate. Post sintering, the multi-up substrate is sized to form individual product substrates and the second discrete non-densifying structure is separated from the individual ceramic substrate and the first non-densifying structure will remain in the ceramic substrate. The second discrete non-densifying structure may also be separated from the multi-up green ceramic laminate prior to sintering.

BRIEF DESCRIPTION OF THE DRAWINGS

FIG. 1(*a*) is a schematic view of a typical metallized ceramic greensheet.

FIG. 1(*b*) is a cross sectional view of a typical green ceramic laminate.

FIGS. 2(*a*)–2(*d*) is a schematic representation of typical substrate distortion in the prior art. FIGS. 2(*a*) and 2(*b*) represent schematic side views and FIGS. 2(*c*) and 2(*d*) represent schematic top views.

FIG. 3(*a*) is a schematic of a metallized ceramic greensheet with inventive discrete non-densifying structures added to control distortion.

FIG. 3(*b*) is a cross section view of a green ceramic laminate with inventive discrete non-densifying structures added to control distortion.

FIGS. 4(*a*)–4(*d*) is a schematic representation of the use of the inventive discrete non-densifying structure on multiple, layers and locations in a green laminate to control post sinter distortion. FIGS. 4(*a*) and 4(*b*) represent schematic side views and FIGS. 4(*c*) and 4(*d*) represent schematic top views.

DETAILED DESCRIPTION OF THE INVENTION

Figure 5:
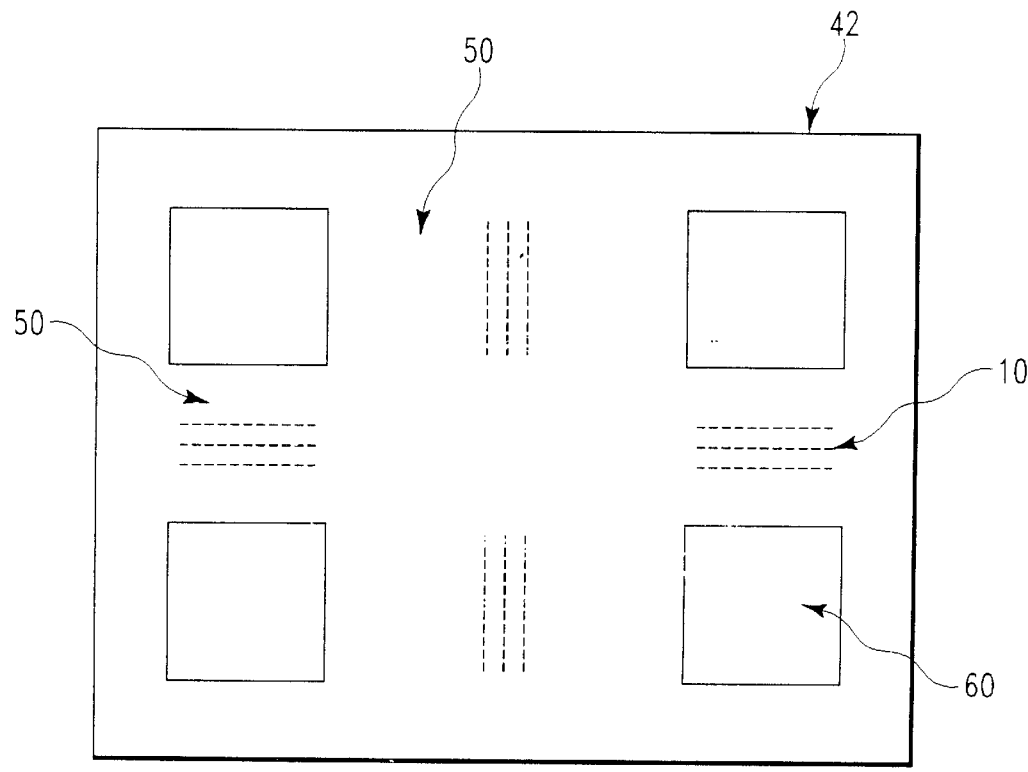
FIG. 5 is a schematic representation of the use of the inventive discrete non-densifying structure applied in the area between the individual ups in a multi-up ceramic green sheet.

During MLC sintering, the green ceramic laminate undergoes a large volume change, typically from about 40% to about 60% shrinkage, to produce the final MLC substrate. In the case of a free sintering process, the MLC substrate shrinks in all three dimensions, typically about 10% to about 20% linearly in each dimension. If the sintering is done under load, then one dimension may experience most of the shrinkage, particularly in the direction of the applied load. This is directly dependent on the method used to apply the sintering pressure to the green ceramic laminate. In both free sintering and sintering under load, the MLC substrate shrinkage occurs during the ceramic densification stage. During this stage the viscosity of the MLC substrate is sufficiently low and allows the internal sintering forces, driven predominantly by surface tension, to shrink the MLC substrate to its final dimensions. The present invention is directed to control distortion during free sintering.

Interaction between the ceramic and metal phases in the green ceramic laminate determines some of the final MLC substrate dimensions, and consequently defines yield levels. Because of their different physicochemical nature, the metal and ceramic phases densify at a different onset and rate. In the case of free sintering, this difference in densification rate directly contributes to the deviation of the post sinter MLC substrate dimensions from design dimensions, primarily because the metal phase in a typical MLC laminate is not uniformly distributed.

In addition, the use of different types of metallurgy in a given ceramic laminate also contributes to substrate distortion during sintering. Both said distortion inducing factors are unavoidable in MLC manufacturing because they are necessary for the electrical and mechanical interconnection function, which the substrate provides between the integrated circuit chip and electronic card.

The disclosed invention is applicable to any personalized ceramic greensheet. A personalized ceramic greensheet may or may not be metallized. The term "personalized" refers to a ceramic greensheet which has been selected for use in the laminate because of a particular characteristic. While this characteristic is typically the metallized pattern screened on the sheet it could also refer to a particular characteristic of a blank or non-metallized sheet such as its thickness. Where the personalized ceramic greensheet is metallized the conductive metal may be, for example, molybdenum, nickel, copper, tungsten, metal-ceramic conductors and metal-glass conductors. The personalized ceramic greensheet may consist of, for example, alumina, borosilicate glass-ceramic or aluminum nitride.

Referring to FIG. 1(*a*), there is shown a schematic view of a typical metallized ceramic greensheet 20, for example a voltage plane. FIG. 1(*b*) shows a cross section of a typical green ceramic laminate 30 formed by stacking the metallized green sheets together, one of which is the metallized ceramic greensheet 20 shown in FIG. 1(*a*), to form a multilayer package with continuous metal wiring. Depending on the metal distribution within the green ceramic laminate 30, various types of distortion, such as deviations from flatness, deviations from squareness in one or more dimensions and local variations in shrinkage, can be seen in sintered MLC ceramic substrates. Some examples of MLC substrate distortion are depicted in FIGS. 2(*a*)–2(*d*).

Referring to FIG. 2(*a*) there is shown the transformation of a green ceramic laminate 30, into a sintered ceramic substrate 70 which shows some level of camber, or deviation from flatness. This example shows a type of bending during densification where the whole substrate bends in one direction only. This type of distortion, referred to as global camber, can be alleviated by many of the techniques described previously.

A more complex situation is shown in FIG. 2(b) where a green ceramic laminate 30 is transformed into a sintered ceramic substrate 71, having multiple modes of bending, some in opposite directions to each other. The extent of bending varies as well. Such variations in individual modes of bending are referred to as local camber. In this case, each area of the sintered substrate with a given bending direction must be treated individually to compensate for the level of local camber.

The sintering forces which produce local and global camber also produce local and global distortion problems. This is illustrated in FIG. 2(c) which shows the transformation of a green ceramic laminate 30 into a sintered ceramic substrate 72, where one side has sintered more than the other. A more systematic and severe distortion pattern in a sintered ceramic substrate 73, is shown in FIG. 2(d). All four prior art cases shown here are for illustration purposes only and it is understood that other distortion patterns are possible and would be controlled by the disclosed invention.

In one embodiment the invention discloses a method to control post sinter dimensions of free sintered ceramic substrates by placing non-densifying structures within the green laminate. Since most MLC processes typically experience at least 10% shrinkage in any given direction, any material selected which sinters less than 2% in the given sinter cycle would be an appropriate non-densifying structure for that application. The term "non-densifying structure" is used to identify any non-densifying object added to the green ceramic laminate to control distortion during sintering which meets the geometric requirements which will be discussed below. The discrete non-densifying structure may be a metal, ceramic, organic or a combination thereof. The non-densifying material, preferably a metal, should be stable in the applicable sintering atmosphere and temperature for a given MLC material set. Ceramic and ceramic/metal composites are examples of other stable non-densifying materials that may be used. Porous materials can also be used as the non-densifying structure provided they meet the limitation of less than 2% densification in a sintering cycle. The discrete non-densifying structure is preferably a porous body whose porosity is less than 50%.

The dimensions of the non-densifying structures placed inside, or on the surface of, a green ceramic laminate to control distortion during a sintering process, must be properly controlled to avoid the generation of defects within the ceramic substrate. The preferred geometry for the non-densifying structure is a thin strip. In the particular case of MLC sintering, the thickness of the dielectric layer (greensheet layer) above or below the non-densifying structure is used as a characteristic length or reference dimension to define the preferable dimensions of the discrete non-densifying structure used in the disclosed invention. The thickness of the discrete non-densifying structure should be preferably less than 25% of the dielectric (greensheet) thickness. The width of the discrete non-densifying structure is preferably less than five times the thickness of the dielectric. The maximum length of a discrete non-densifying structure is preferably less than fifty times the dielectric thickness. If the thickness of the dielectric layer is different above and below the non-densifying structure, then the thinner dielectric layer should be used for the characteristic length or reference dimension for that particular location within the green ceramic laminate.

In some special cases, the area within a green ceramic laminate may require the use of non-densifying structures longer than the maximum preferred thin strip length. In such a situation shorter strips can be positioned together to form more complex and compounded non-densifying structures. When using this method the minimum length of the thin strip should be not less than four times the thin strip width. It is also necessary to avoid the formation of long straight lines in the compound structures. This particular situation is shown in FIG. 3(a), where a large non-densifying structure 10 has been added to a green sheet 21 to modify distortion near the laminate corners. FIG. 3(b) shows a cross section of a green ceramic laminate 31, assembled with at least one such green sheet 21.

Referring again to FIG. 3(a) there is shown the addition of a discrete non-densifying structure 10 to a metallized ceramic green sheet 21. The discrete non-densifying structure 10 can be a single locally continuous member or multiple or compounded discrete members positioned together. The preferred material for the discrete non-densifying structure 10 is a solid metal and or a porous metal which does not densify during the sintering process. The discrete non-densifying structure 10 must be selected from a material compatible with the ceramic. Preferably the linear shrinkage of the discrete non-densifying structure during sintering is less than 20% of the linear shrinkage of the green ceramic laminate.

The discrete non-densifying structure 10 need not be a metal. Ceramic materials which are already densified may also be used, but the dimensions of the discrete non-densifying structure 10 must be significantly reduced to provide the same functionality. In addition, the ceramic materials selected for the discrete non-densifying structure 10 must not melt during the sintering process. In general metals have additional advantages over ceramics as materials for the discrete non-densifying structure 10. Metals can deform without breaking under load. More significantly, properly grounding the non-densifying metal structures 10 in the MLC substrate can provide electrical shielding. In addition, the non-densifying structure may be located so as to act as an antenna. For application with free sintered ceramic products, the discrete non-densifying structure 10 can be made from, for example, copper, molybdenum, tungsten, nickel, nickel alloys, stainless steel, dense alumina, zirconia, and metal-ceramic composites.

Referring again to FIG. 3(a) the discrete non-densifying structure 10 is added to the MLC substrate by placing the discrete non-densifying structure 10 on the ceramic green-sheet 21. FIG. 3(b) shows the individual ceramic green-sheets formed into a green ceramic laminate 31. The discrete non-densifying structure 10 may be placed on multiple greensheets, including the top and bottom layers, in a laminate to provide the desired dimensional control. In a preferred embodiment the discrete non-densifying structure 10 comprises metal strips with thickness ranging from 0.0003 inch to 0.001 inch, and width in the range from 0.002 inch to 0.008 inch. These preferred dimensions are for an MLC substrate built from ceramic greensheets with a thickness in the range of 0.008 to 0.011 inches. It would be obvious to one skilled in the art to adjust the thickness and width of the metal strip outside theses ranges by varying such factors as geometry, for example wires, and/or densification characteristics. The compound length of the discrete metal strips is a factor that should be kept short relative to the product size. As an example, for a 32 mm MLC substrate, the length of the metal strip is preferred to be less than 10 mm.

To elaborate further, an experiment was performed where 0.011 inch thick ceramic greensheet layers were used to form ten layer MLC substrates. A total of 10 metal strips were added to each green ceramic laminate between ceramic greensheet layer 2 and ceramic greensheet layer 3. All 10 metal strips were aligned parallel to the y-axis. All 10 metal strips were made from molybdenum and were 0.001 inch thick and 1.0 mm wide. In a first green ceramic laminate the 10 metal strips were all 10 mm in length. In a second green ceramic laminate the metal strips were all 5 mm in length. A third green ceramic laminate was also processed as a control without metal strips. The first green ceramic laminate with metal strips 10 mm in length showed a 1.2 mm change in camber and the second green ceramic laminate with metal strips 5 mm in length showed a 0.5 mm change in camber. This demonstrates that the change in ceramic substrate camber is dependent on the metal strip length.

The metal strips also induced a change in the MLC substrate final dimensions relative to the control MLC substrate without metal strips. The second green ceramic laminate with metal strips 5 mm in length showed a 1.2% increase in length along its y-axis upon sintering as compared to the sintered control substrate. The first green ceramic laminate, with metal strips 10 mm in length, showed a 1.8% increase in length along its y-axis upon sintering as compared to the sintered control substrate. The shrinkage in the x direction was similar.

This example is illustrated schematically in FIG. 4. Referring to FIG. 4(a) the left side shows the addition of metal strips 10 in at least one ceramic greensheet layer of the green ceramic laminate 32 to illustrate the compensation needed for an elevated camber impact. The non-densifying metal strips 10 are added on the side near the center of curvature of the deformed laminate 70 shown in FIG. 2(a). It should be understood that the location and number of ceramic greensheet layers requiring this structure in an actual MLC substrate would change and needs to be optimized for a particular design. The right side of FIG. 4(a) shows the sintered substrate 74 and the effect of the metal strips 10 on controlling the post sinter camber of the corresponding ceramic substrate 70 of FIG. 2(a). The inventive metal non-densifying structure 10 in this case counterbalances the imbalance in the conductor metal distortion of the prior art green laminate 30.

FIG. 4(b) is a schematic representation of the use of the discrete non-densifying structure 10 on multiple layers to control post sinter distortion. The left side of FIG. 4(b) shows the addition of the discrete non-densifying structure 10, selectively positioned on top and bottom layers of the green ceramic laminate 33. The right side of FIG. 4(b) shows the effect of the non-densifying structure 10 on controlling the post sinter camber of the ceramic substrate 75. In contrast, the prior art method where no inventive discrete non-densifying structure 10 is used, as shown in laminate 30 of FIG. 2(b), would result in the typical camber problem in sintered substrate 71, as shown in FIG. 2(b).

The optimum size and distribution of the discrete non-densifying structure 10 is dependent on the particular MLC substrate design and should be customized to control the types of distortion problems encountered. It would be obvious to one skilled in the art that some areas in the MLC substrate design could be reserved for the addition of the discrete non-densifying structure 10.

FIG. 4(c) illustrates the inventive method whereby the addition of the discrete non-densifying structure 10 is to specifically tailored locations to control the local post sinter distortion problems typically encountered in the prior art method shown in FIG. 2(c). On the left side of FIG. 2(c) is shown the prior art green ceramic laminate 30. On the right side of FIG. 2(c) is the prior art post sinter ceramic substrate 72 with a typical post sinter substrate distortion. In contrast, on the left side of FIG. 4(c) is shown the addition of the inventive discrete non-densifying structure 10 to selective areas of the green ceramic laminate 34. The size, orientation and number of strips making up the discrete non-densifying structure 10 will depend on the particular product design. The right side of FIG. 4(c) illustrates the addition of the inventive discrete non-densifying structure 10 to tailored locations relieving the post sinter distortion as shown in ceramic substrate 76.

Similarly, FIG. 4(d) illustrates the addition of the discrete non-densifying structure 10 in the green ceramic laminate 35 in selective locations to solve the post sinter distortion problems, illustrated in FIG. 2(d), inherent in the design of a particular MLC sintered substrate 73. On the left side of FIG. 2(d) is shown the prior art green ceramic laminate 30. On the right side of FIG. 2(d) is the prior art post sinter ceramic substrate 73 with post sinter substrate distortion. On the left side of FIG. 4(d) is shown the addition of the inventive discrete non-densifying structure 10 to several localized areas of the green ceramic laminate 35. The right side of FIG. 4(d) illustrates how the addition of the discrete non-densifying structure 10 to tailored locations control the non-uniform as well as uniform post sinter distortion to produce a ceramic substrate 77 with reduced post sinter distortion.

Non-uniform metal distribution inside the sintered MLC substrate, in conjunction with non-uniform densification forces created by the finite size of the MLC substrate, create camber in the post sinter MLC substrate. The uniformity in metal distribution can be better controlled when the green laminate contains one "up", or one product sample per green laminate, as it occupies most of the laminate area. However, uniform metal distribution is not possible when the sintered green ceramic laminate includes a number of smaller product samples, as in a multi-up green ceramic laminate. In this case the individual smaller product samples or ups are separated by areas with no metallurgy generally known as the kerf area.

FIG. 5 illustrates the control of camber and distortion in a multi-up laminate. Referring to FIG. 5, it is shown that the discrete non-densifying structure 10 is applied in the area between the ups, in the kerf area 50, between the individual product samples 60 in the multi-up ceramic green sheet 40. The kerf area 50 is a non-functional and non-metallized area separating the individual product samples 60. A plurality of discrete non-densifying structure 10 can be applied to multi-up ceramic greensheet layers 40 as needed to control the post sinter camber of the green ceramic laminate. The use of a discrete non-densifying structure 10 modifies the distribution of the sintering force during the ceramic densification step, by locally altering the sample geometry. Each discrete non-densifying structure 10 provides a zero surface displacement to the viscous deformation of the densifying ceramic body. The discrete non-densifying structure 10 will control the post sinter distortion between the individual product samples 60 of the multi-up multilayer ceramic substrate. The discrete non-densifying structure 10 can be separated from the MLC substrate after sintering using a standard wet sizing process.

Figure 6:
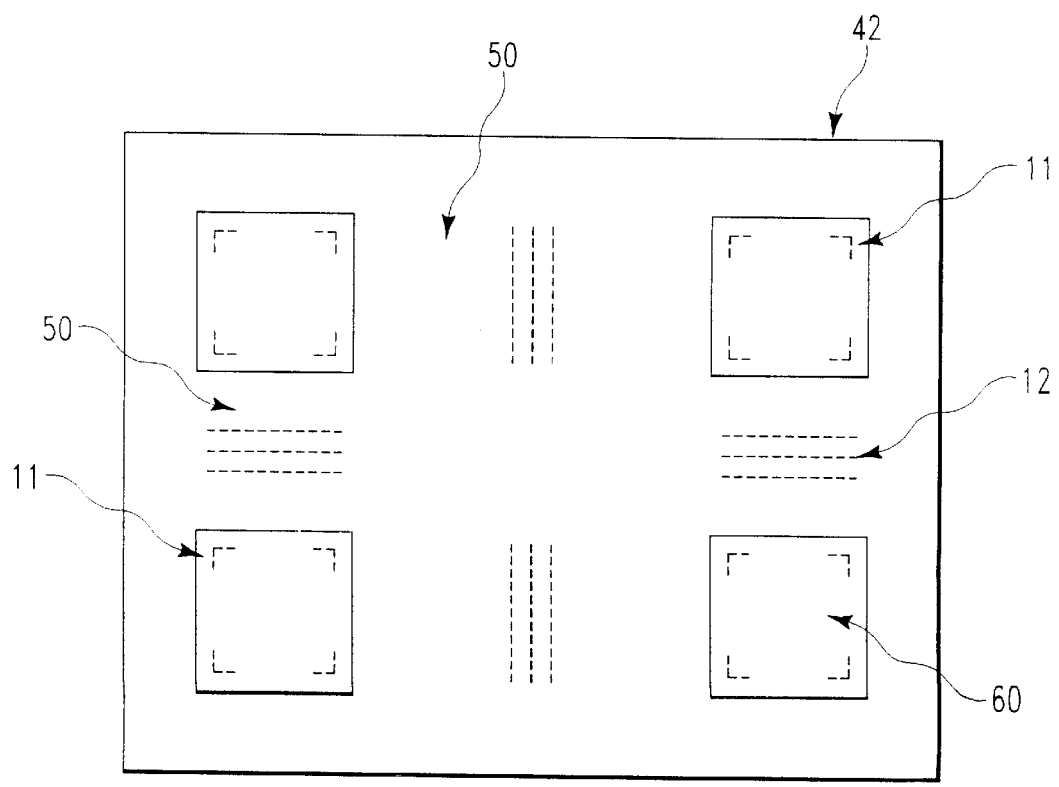
FIG. 6 is a schematic representation of the use of the discrete non-densifying structure applied in both the area between the individual ups and in the product area in a multi-up ceramic green sheet.

Referring now to FIG. 6, there is shown another embodiment of the invention. In this embodiment, a first discrete non-densifying structure 11, comprising metal strips, is placed on the ceramic greensheet 42 within the product area of the individual product samples 60. A second discrete non-densifying structure 12 is placed in the kerf area 50, the non-metallized area, separating the individual product samples 60. The second discrete non-densifying structure 12 will control the post sinter distortion between the individual product samples 60 of the multi-up multilayer ceramic substrate. The second discrete non-densifying structure 12 is separated from the MLC substrate after sintering using a standard wet sizing process. The first discrete non-densifying structure 11 will remain inside the ceramic substrate for dimensional control in the product area during sintering. The first discrete non-densifying structure 11 and the second discrete non-densifying structure 12 may both be placed on the same ceramic greensheets in a laminate or they may be placed on different sheets depending on the nature of the distortion in a given laminate.

It will be apparent to those skilled in the art having regard to this invention that other modifications of this invention beyond those embodiments specifically described here may be made without departing from the spirit of the invention. Accordingly, such modifications are considered within the scope of the invention as limited solely by the appended claims.

What is claimed is:

1. A method to control the dimensions of a free sintered multilayer ceramic substrate comprising the steps of:
    providing a plurality of discrete non-densifying structures,
    placing said plurality of discrete non-densifying structures at selected locations on at least one personalized ceramic greensheet,
    placing said at least one personalized ceramic greensheet having said discrete non-densifying structure in a stack of personalized ceramic greensheets,
    laminating said stack of personalized ceramic greensheets to form a green ceramic laminate,
    free sintering said green ceramic laminate to form a multilayer ceramic substrate wherein said plurality of discrete non-densifying structures will at least partially control the local dimensions of said multilayer ceramic substrate.

2. The method of claim 1 wherein said plurality of discrete non-densifying structures are metal, ceramic, organic or a combination thereof.

3. The method of claim 1 wherein said plurality of discrete non-densifying structures are a porous body whose porosity is less than 50%.

4. The method of claim 1 wherein said plurality of discrete non-densifying structures are selected from the group consisting of molybdenum, nickel, copper, tungsten, stainless-steel and zirconia.

5. The method of claim 1 wherein said at least one personalized ceramic greensheet is
    a ceramic material selected from the group consisting of alumina, borosilicate glass-ceramic and aluminum nitride.

6. The method of claim 1 wherein said at least one personalized ceramic greensheet is
    metallized with a metal selected from the group consisting of molybdenum, nickel, copper, tungsten, metal-ceramic conductors and metal-glass conductors.

7. The method of claim 1 wherein the linear shrinkage of said plurality of discrete non-densifying structures during sintering is less than 20% of the linear shrinkage of said green ceramic laminate.

8. The method of claim 1 wherein said plurality of discrete non-densifying structures are electrically grounded in said multilayer ceramic substrate thereby providing electrical shielding.

9. The method of claim 1 wherein said plurality of discrete non-densifying structures comprise discontinuous metal strips.

10. The method of claim 1 wherein the thickness of said plurality of discrete non-densifying structures are less than 25% of the thickness of said at least one personalized ceramic greensheet.

11. The method of claim 1 wherein the width of said plurality of discrete non-densifying structures are less than 5 times the thickness of said at least one personalized ceramic greensheet.

12. The method of claim 1 wherein the length of said plurality of discrete non-densifying structures are less than fifty times the thickness of said at least one personalized ceramic greensheet.

13. The method of claim 1 wherein said plurality of discrete non-densifying structures act as an antenna.

14. A method to control the dimensions of a free sintered multilayer ceramic substrate which is laminated and sintered as a multi-up green ceramic laminate, the method comprising the steps of:
    providing at least one discrete non-densifying structure,
    placing said at least one discrete non-densifying structure on at least one multi-up personalized ceramic greensheet having a plurality of product samples in the kerf area between the individual product samples,
    placing said at least one multi-up personalized ceramic greensheet having said discrete non-densifying structure in a stack of personalized multi-up ceramic greensheets,
    laminating said stack of personalized multi-up ceramic greensheets to form a multi-up green ceramic laminate,
    sintering said multi-up green ceramic laminate to form a multi-up multilayer ceramic substrate wherein said at least one discrete non-densifying structure will at least partially control the local dimensions of said multi-up multilayer ceramic substrate.

15. The method of claim 14 further comprising the step of sizing said multi-up multilayer ceramic substrate to form individual multilayer ceramic substrates and thereby separating said at least one discrete non-densifying structure from said individual multilayer ceramic substrates.

16. The method of claim 14 wherein said at least one discrete non-densifying structure is separated from said multilayer ceramic substrate by wet saw sizing.

17. A method to control the dimensions of a free sintered multilayer ceramic substrate which is laminated and sintered as a multi-up green ceramic laminate, the method comprising the steps of:
    providing a first at least one discrete non-densifying structure,
    providing a second at least one discrete non-densifying structure,
    placing said first at least one discrete non-densifying structure on at least one personalized multi-up ceramic greensheet having a plurality of product samples in at least one of the plurality of product samples,
    placing said second at least one discrete non-densifying structure on at least one personalized multi-up ceramic greensheet having a plurality of product samples in the kerf area between the individual product samples,
    placing said at least one personalized multi-up ceramic greensheet having said first and second discrete non-densifying structures in a stack of personalized multi-up ceramic greensheets, laminating said stack of personalized multi-up ceramic greensheets to form a multi-up green ceramic laminate, sintering said multi-up green ceramic laminate to form a multi-up multilayer ceramic substrate wherein said first at least one discrete non-densifying structure and said second at least one discrete non-densifying structure will at least partially control the local dimensions of said multi-up multilayer ceramic substrate.

18. The method of claim 17 further comprising the step of sizing said multi-up multilayer ceramic substrate to form individual multilayer ceramic substrates, thereby separating said second at least one discrete non-densifying structure from said individual multilayer ceramic substrates.

19. The method of claim 17 wherein said second at least one discrete non-densifying structure is separated from said multi-up green ceramic laminate prior to sintering.

20. The method of claim 17 wherein said at least one discrete second non-densifying structure is separated from said multilayer ceramic substrate by wet saw sizing.

* * * * *